United States Patent [19]

Kaminski et al.

[11] Patent Number: 4,973,912
[45] Date of Patent: Nov. 27, 1990

[54] METHOD FOR CONTACTLESS MEASUREMENT OF A RESISTANCE ARRANGED IN THE SECONDARY CIRCUIT OF A TRANSFORMER AND DEVICE FOR CARRYING OUT THE METHOD

[75] Inventors: Detlef Kaminski, Kornwestheim; Bernd Schmitfranz, Esslingen; Rolf Adomat, Immenstaad; Walter Ulke, Friedrichshafen; Burkhard Voigt, Immenstaad, all of Fed. Rep. of Germany

[73] Assignee: Daimler-Benz Aktiengesellschaft, Fed. Rep. of Germany

[21] Appl. No.: 339,102

[22] Filed: Apr. 17, 1989

[30] Foreign Application Priority Data

Apr. 15, 1988 [DE] Fed. Rep. of Germany ....... 3812633

[51] Int. Cl.$^5$ .............................................. G01R 27/02
[52] U.S. Cl. ..................................... 324/652; 324/708
[58] Field of Search ........... 324/57 Q, 61 QS, 61 QL, 324/62 R, 379, 652, 708; 340/436

[56] References Cited

U.S. PATENT DOCUMENTS

| | | |
|---|---|---|
| 2,604,515 | 7/1952 | McNulty ............................ 324/379 |
| 3,049,666 | 8/1962 | Anderson .......................... 324/57 Q |
| 3,163,818 | 12/1964 | Spaven ............................. 324/57 Q |
| 3,659,197 | 4/1972 | Alley et al. ........................ 324/546 |
| 3,906,340 | 9/1975 | Wingfield et al. .................. 324/652 |
| 3,990,002 | 11/1976 | Baum ................................ 324/546 |
| 3,990,040 | 11/1976 | Gleitz et al. ........................ 340/436 |
| 4,242,631 | 12/1980 | Hall ..................................... 324/62 |
| 4,446,427 | 5/1984 | Lourenich .......................... 324/227 |
| 4,808,911 | 2/1989 | Oaks .................................. 324/57 Q |
| 4,810,950 | 3/1989 | Young ................................ 324/708 |

Primary Examiner—Reinhard J. Eisenzopf
Assistant Examiner—Maura K. Regan
Attorney, Agent, or Firm—Evenson, Wands, Edwards, Lenahan & McKeown

[57] ABSTRACT

A method and a device for transmitting and for measuring resistance values, is particularly provided for use in motor vehicles, for the constant control of airbag systems. In the method and device an exciter signal coupled into a secondary-side resonant LCR circuit from the primary side via inductively coupled coils is interrupted, transmitted back to the primary side of the transformer and is there used for determining the resistance value by evaluating the time constant of the exciter response.

20 Claims, 4 Drawing Sheets

CURRENT EXCITATION
200 μs / Div

RESPONSE:
τ = 640 μs

R = 0 Ω

τ = 340 μs

R = 2 Ω

τ = 180 μs

R = 5 Ω

METHOD FOR CONTACTLESS MEASUREMENT OF A RESISTANCE ARRANGED IN THE SECONDARY CIRCUIT OF A TRANSFORMER AND DEVICE FOR CARRYING OUT THE METHOD

BACKGROUND AND SUMMARY OF THE INVENTION

The invention relates to a method for the contactless measurement of a resistance arranged in the secondary circuit of a transformer and to a device for carrying out the method.

In U.S. Pat. specification No. 4,242,631, a test probe device for test instruments is disclosed with the aid of which complex impedences can be measured whilst largely preventing a falsification of the measurement value due to connection impedences. It utilizes a reference resistance to which the impedence to be measured is referred. As such, it is suitable for three-wire and four-wire measurements in carrier frequency technology. There is no provision for emitting a signal which is associated with at least one particular resistance value.

In Swiss Pat. Specification No. 466,869, an arrangement for the electrically isolated contactless measurement of the absolute value of impedences is disclosed. It utilizes an oscillator with drive and feedback winding, from which latter also a signal representing the measured value is taken. Between the two windings, a measuring winding or measuring loop is arranged which is terminated with the impedence to be measured. Depending on the magnitude of this impedence, the field lines emanating from the drive winding and penetrating the measuring winding are prevented from passing into the feedback winding. The measurement signal, which can be provided by a subsequent amplifier stage, also changes correspondingly. To be able to measure the impedence mounted at the moving object, the measuring winding must be shaped and can only be movable relative to the two other windings of the transformer in such a manner that the magnetic flux chaining in the feedback path remains unchanged. An appropriate transformer must therefore be produced with high accuracy and is correspondingly expensive.

It is also disclosed to provide, for detecting, for example, the short-circuit condition of a signalling horn switch and for driving an impact-absorbing airbag in the steering wheel of a motor vehicle, four contact pins and four slip rings which are components of corresponding triggering circuits. The contact pins are pressed against the slip rings by a spring force. In this arrangement, grinding noises are produced with each steering movement which are felt to be disturbing with increasing attempts to attenuated noise in the interior of motor vehicles.

The constructional space in the steering wheel of a motor vehicle is generally restricted, particularly if an airbag system is accommodated in the steering wheel. It is therefore necessary to accommodate as few components as possible in the steering wheel. When an airbag system is used, which must be immediately operation in an emergency, a continuous check of the operability is also found to be necessary. For this purpose, the resistance value of the firing cap, which should be within a range of 1.8 ohms to 2.5 ohms, is subjected to a continuously repeated measurement. The measuring current used during this process must not exceed 30 mA.

The transmission of corresponding impedence signals by inductively coupled coils depends on the distance between the two coils. In this connection, it must be taken into consideration that the coupling characteristics of the transformer are not fixed due to installation and production tolerances and thus the usual methods for determining resistance with the aid of current and voltage measurement do not achieve the desired measuring accuracy.

Methods hitherto used are restricted to the measurement of the amplitude of the response to an initiated excitation signal. The user is forced to maintain a constant and correct coil spacing. However, this is not always possible in practice since, for example in the workshop, the work cannot proceed with an accuracy of fractions of mm during the removal and installation of a steering wheel.

Therefore, the present invention has an object of providing a method by which signals, particularly between rotating and stationary parts such as steering wheels and steering columns or other components in motor vehicles, can be reliably and noiselessly transmitted, largely independently of constraining installation rules and as few components as possible are present on the secondary side of a transformer, that is to say in the steering wheel.

These and other objects are achieved by a method wherein the time constant for a decaying sinusoidal response is employed to determine a value of an unknown resistance is a manner which is independent of the transformer coupling.

It is also an object of the present invention to provide a device for carrying out the method.

This object is achieved by a device including an excitation circuit for exciting a tuned circuit containing the unknown resistance to be measured and a time constant wave analyzer to determine the time constant of the resulting response to the excitation signal.

Two inductively coupled coils which are opposite to one another in the rotatable steering wheel or in the stationary vehicle chassis, form a transformer which provides for the actuation of the signalling horn and the transmission of energy for firing the airbag in the case of an accident. At the same time, a continuous check of the airbag system is possible via the transformer. On the secondary side of the transformer, a component is located, for example the firing cap of the airbag in this case, the resistance of which is to be determined from the primary side of the transformer.

Other objects, advantages and novel features of the present invention will become apparent from the following detailed description of the invention when considered in conjunction with the accompanying drawings.

DETAILED DESCRIPTION OF THE DRAWINGS

Figure 1:
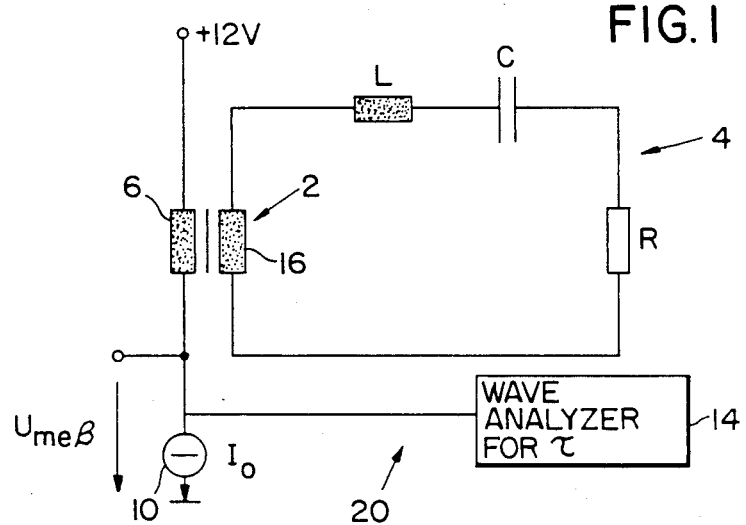
FIG. 1 shows a basic circuit sketch of a transformer and tuned LCR circuit including a preferred embodiment of the device according to the present invention.

In FIG. 1, the secondary-side, series-tuned LCR circuit 4, where R is the resistance to be determined, is excited for a short time by a current pulse, for example a limited number of sinusoidal oscillations, via the transformer 2. After that, the primary side 6 of the transformer 2 is terminated with a high impeeence so that the transformer 2 now only has the effect of an inductance which is connected in series with the coil L.

In the tuned circuit 4, a damped oscillation forms. The damping is only determined by the values R' and L' where R' is obtained from the series circuit of R and the ohmic resistance $R_s$ of the transformer 2 and the inductance L and L' is composed of the inductance L and the inductance Lü of the transformer 2. Thus, damping is independent of the transformer coupling. An equrvalent of this damped oscillation can be picked up at the primary side of the transformer 2. The equation for the voltage is:

$$U(t) = \hat{U}_o \cdot \exp\left(-t\frac{R'}{2L'}\right) \cdot \sin(\omega_o t)$$

where $\hat{U}_o$ is the peak value of the response;
U(t) is the voltage variation of the resulting response with respect to time; and $$\omega_o = \sqrt{\frac{1}{LC} - \frac{R^2}{4L^2}}.$$

The time constant of the oscillating voltage U(t) is $\tau$ which equals 2 . L'/R' and is a measure of the magnitude of the secondary resistance R to be determined, which can be obtained independently of the coupling characteristics of the transformer.

The resonant circuit 4 used can be constructed as, for example, a serial or parallel circuit depending on the measuring requirements. It is also conceivable to take the inductance L out of the resonant circuit 4 and use the inductance of the transformer secondary side alone.

Various method already known can be used for electronially determining the time constant t:

Sampling the peak value $\hat{U}_o$ of the response and counting the oscillations until a predetermined threshold $\hat{U}_o/m$ is reached, for example $\hat{U}_o/2$;

Sampling the peak value $U_o$ of the response and sampling the peak value of $U_1$ after a defined time interval T; information on $\tau$ and R is contained in the expression $\hat{U}_1/\hat{U}_0$; and Forming the envelope curve of the response and measuring the time interval between two defined limits.

The invention will be explained further with reference to three measurement examples:

EXAMPLE 1

Determining the voltage variation $U_{meB}(t)$ at the primary side of the transformer 2 with short-time excitation and constant coupling factor ü of the transformer. In this example, the secondary-side resistance is varied.

Figure 2A:
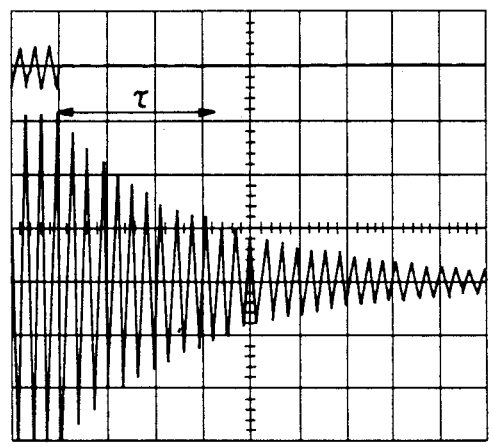
FIGS. 2a–2c show the representation of the response voltage variations of the tuned LCR circuit for three different resistances respectively.
Figure 2B:
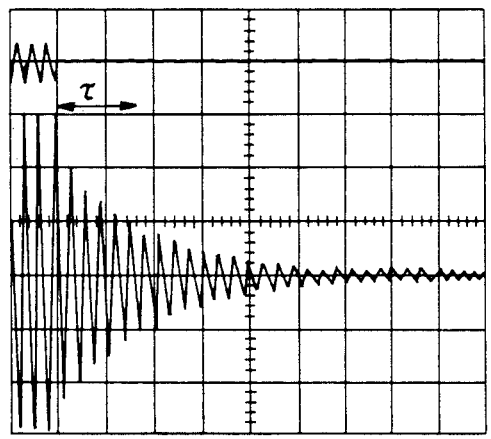
Figure 2C:
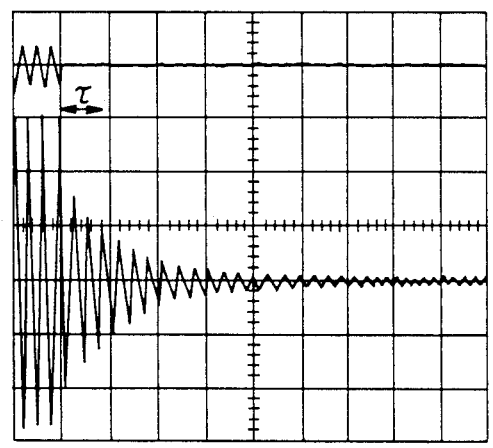

FIGS. 2*a*–2*c* show the voltage variations for three secondary side resistances R of 0 ohms, 2 ohms and 5 ohms respectively. In this example, the time constants $\tau$ during the decay to a predetermined amplitude level, which can be measured, can be seen. The damping becomes greater and the time constant $\tau$ smaller with increasing resistance. The time constant $\tau$ of the decaying sinusoidal function contains the information on the magnitude of the secondary resistance R. The effective secondary resistance L', as noted above, is composed of the inductance L and the inductance of the transformer Lü and is about 1 mH in the example. The quantity R', as noted above, is obtained from the series circuit of R and the ohmic resistances $R_s$ of the transformer and the inductance L. Iathe present example, $R_s$ is about 3 ohms.

In the upper region of each of the FIGS. 2*a*–2*c*, the current excitation introduced into the transformer can be seen up to the time it is switched off. With an inductance of L=820 μH and a capacitance of C=100 nF, the time constants $\tau$=640 μs, 340 μs and 180 μs were obtained for the resistances of 0 ohms, 2 ohms, and 5 ohms.

EXAMPLE 2

Figure 3:
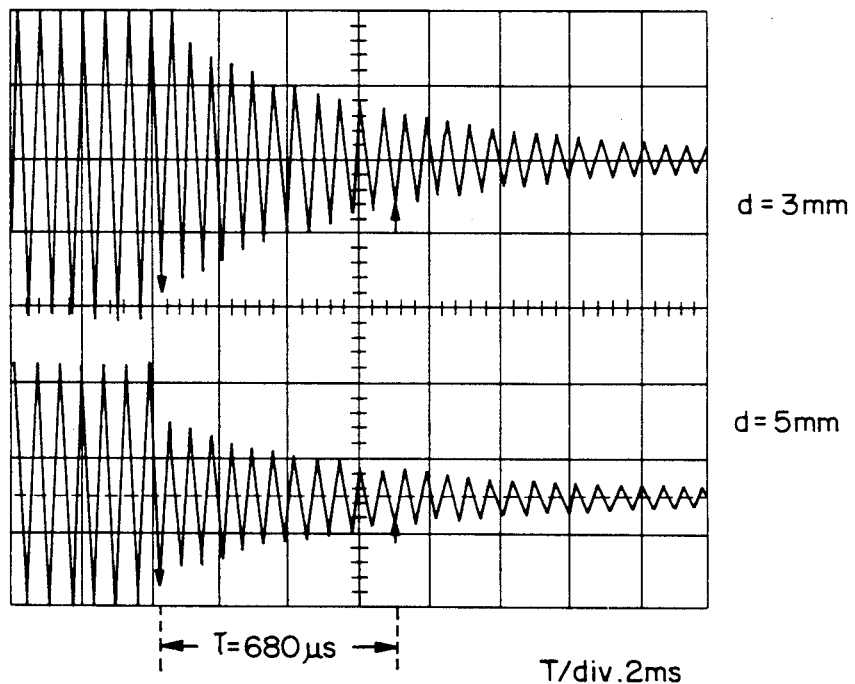
FIG. 3 shows the representation of the response voltage variations for various coil spacings of the transformer.

The effective airgap was changed in the transformer. The resultant maximum amplitude values are show in FIG. 3. The upper variation was obtained with approximately 3 mm airgap and the lower at approximately 5 mm airgap. The different coupling factors obtained due to the change airgap lead to a change in the amplitude of the decaying sinusoidal response, but not to detectable change in the time constant determined.

The method described can be advantageously used in all resistance measurements in which potential isolation, freedom from contact and/or high reliability, here achieved by using only a few components, are mandatory.

A device 20 for carrying out this method is illustrated in FIG. 1 and comprises the transformer 2 which is connected to a switchable current exciter device 10 on the primary side 6 and, also on the primary side, to a wave analyzing device 14 for analyzing the time constant of the exciter response after the exciter signal has been switched off. On the secondary side 16, a resonant LCR circuit 4 is connected to the transformer 2 in which the R is the resistance of a component to be measured. Such components can be switches, sensors, resistance wires or similar components.

If the device 20 is used, for example, for transmitting signals in the case of parts which rotate relatively to one another, the coils are constructed to be circular and freely movable with respect to one another.

Such signals in the case of rotating components such as steering wheels or wheels can be, for example in a motor vehicle, the triggering of the signalling horn switch, the checking or the triggering of an airbag system or the checking of the tire air pressure.

In addition to the analysis of the resistance of a single component, the joint analysis of the resistances of several components is also possible in accordance with the teachings of the present invention. This is shown with reference to Example 3 of the analysis of airbag and signalling horn device.

Figure 4:
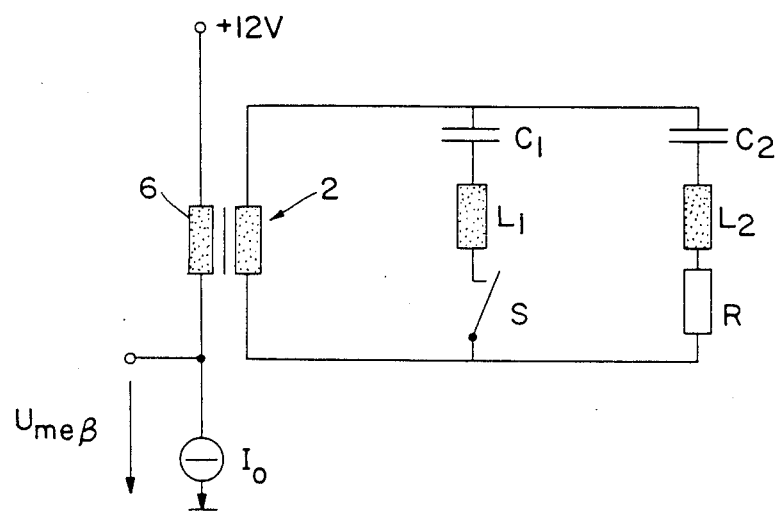
FIG. 4 shows a basic circuit sketch with two parallel circuits which can be analyzed in accordance with the teachings of the present invention, and FIGS. 5*1*–5*b* show a representation of excitation and resonant response for two circuits.

FIG. 4 shows the secondary side of the transmission device, in this case the steering wheel, which is divided into two parallel circuits $C_1$ $L_1$ S and $C_2$ $L_2$ R. In this arrangement, R is the resistance of the firing cap and S is the triggering switch of the signalling horn.

EXAMPLE 3

Figure 5A:
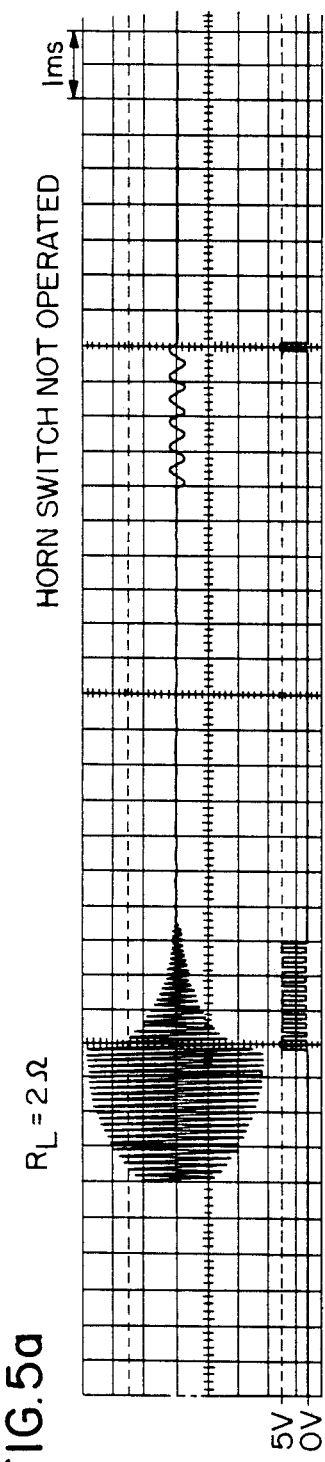
Figure 5B:
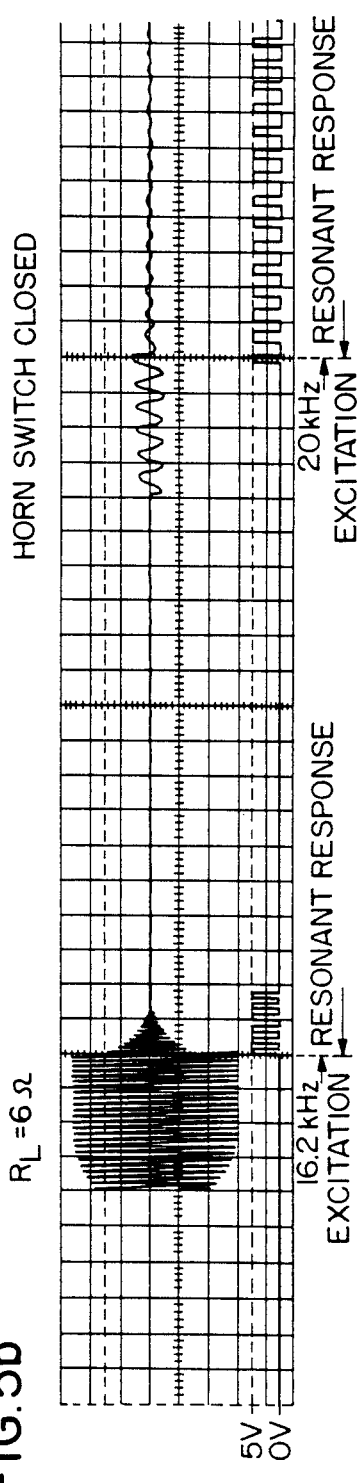

FIGS. 5a–5b show the periodically repetitive sequence of an analysis step.

In FIG. 5a, the circuit of the airbag system is initially excited with an exciter frequency of 16.2 kHz in the left-hand part of the picture. Then the excitation is switched off and from the resonant response the resistance value is determined, here R=2 ohms. The circuit in which the signalling horn switch is located has a high impedance at this frequency.

Some time (ms) later, a different exciter frequency of approximately 3 khz is used at which the circuit of the airbag has a high impedence. When the signalling horn switch is not operated, there is no resonant response after switching off the excitation in the right-hand part of FIG. 5a.

This feeding-in of the various frequencies occurs periodically.

In FIG. 5b, a different resistance is used in the airbag system, R=5 ohms, which can be seen from the changed resonant response. The effect of a closed signalling horn switch is shown in the right-hand part of the Figure. From the resonant response, the triggering of the signalling horn switch can be detected. This is correspondingly detected by the analyzing circuit and leads to the signalling horn being triggered.

In the same manner, several different circuits can also be analyzed, the circuits in each case being excited at different frequencies.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. Method for the contactless measuring of a resistance arranged in a secondary circuit of a transformer with inductively coupled coils having a primary and secondary side in a motor vehicle, comprising the steps of:
   exciting a resonant circuit, which is connected to a resistance to be measured on the secondary side of the transformer, by an excitation signal from a primary side of the transformer,
   interrupting the excitation signal,
   sensing a decaying excitation response at the primary side and
   determining, as a function of time constant of the decaying excitation response sensed at the primary side, a value of the resistance to be measured.

2. Method according to claim 1, wherein the secondary-side resonant circuit is excited at different frequencies.

3. Method according to claim 1, wherein active electronics are absent on the secondary side of the transformer.

4. Method according to claim 1, wherein coupling characteristics of the coils are independent of determination of the resistance to be measured.

5. Method according to claim 1, wherein a peak value $U_o$ of the excitation response is sampled and the oscillations are counted until a predetermined threshold value $U_o/m$ is reached.

6. Method according to claim 1, wherein a peak value $U_o$ of the excitation response and a peak value $U_1$ after a defined time interval T is sampled.

7. Method according to claim 1, wherein an envelope curve of the excitation response is formed and a time interval between two defined limits is measured to determine the time constant of the excitation response.

8. Method according to claim 1, wherein circular coils are used in the transformer.

9. Device for the contactless measurement of a resistance arranged in a secondary winding of a transformer with airgap between a primary winding and a secondary winding comprising:
   (a) a first resonant LC circuit means connected to the secondary winding together with the resistance to be measured:
   (b) an exciter means connected to the primary winding for providing an excitation signal that can be switched off to the primary winding; and
   (c) analyzing means connected to the primary side of the transformer, for measuring a primary voltage after the excitation signal has been switched off to determine as a function of a time constant of a decaying excitation response at the primary side, a value of a resistance to be measured.

10. Device according to claim 9, wherein the transformer comprises coils which can be rotated relative to one another and can be moved independently of one another.

11. Device according to claim 10, wherein the coils are circular.

12. Device according to claim 9, wherien the primary and secondary sides of the transformer are provided between movable parts.

13. Device according to claim 12, wherein the movable parts are a wheel and chassis of a vehicle.

14. Device according to claim 9, wherein at least one further resonant circuit means is provided in parallel with the first resonant circuit means, the at least further resonant LC circuit means being connected to the secondary winding, a resistance to be measured being in each case located in the at least one further resonant circuit means.

15. Device according to claim 14, wherein the resistance to be measured in the at least one of the first and further resonant LC circuit means is an airbag system of an occupant restraining system and a switch for triggering a remotely located auxiliary device.

16. Device according to claim 9, wherein the analyzing means connected to the primary side is a time constant determining means for determining oscillation time constants.

17. Device according to claim 9, wherein the primary-side analyzing means is connected to a device for signal transmission.

18. Device according to claim 17, wherein the value of the resistance to be measured determines if operation of an auxiliary device is required.

19. Device according to claim 17, wherein the value of the resistance to be measured determines if an airbag system is operational.

20. Device according to claim 9, wherein the exciter means triggers operation of an airbag system.

* * * * *